United States Patent
Yamaji et al.

(10) Patent No.: US 11,915,100 B2
(45) Date of Patent: Feb. 27, 2024

(54) RESONATOR, OSCILLATOR, AND QUANTUM COMPUTER

(71) Applicant: NEC CORPORATION, Tokyo (JP)

(72) Inventors: Tomohiro Yamaji, Tokyo (JP); Tsuyoshi Yamamoto, Tokyo (JP)

(73) Assignee: NEC CORPORATION, Tokyo (JP)

(*) Notice: Subject to any disclaimer, the term of this patent is extended or adjusted under 35 U.S.C. 154(b) by 232 days.

(21) Appl. No.: 17/115,971

(22) Filed: Dec. 9, 2020

(65) Prior Publication Data
US 2021/0201188 A1    Jul. 1, 2021

(30) Foreign Application Priority Data
Dec. 27, 2019  (JP) .................. 2019-238374

(51) Int. Cl.
| | | |
|---|---|---|
| G06N 10/00 | (2022.01) | |
| H03B 15/00 | (2006.01) | |
| G06N 10/40 | (2022.01) | |
| H10N 60/82 | (2023.01) | |
| H10N 60/80 | (2023.01) | |

(52) U.S. Cl.
CPC ............ *G06N 10/00* (2019.01); *G06N 10/40* (2022.01); *H03B 15/003* (2013.01); *H10N 60/805* (2023.02); *H10N 60/82* (2023.02)

(58) Field of Classification Search
None
See application file for complete search history.

(56) References Cited

U.S. PATENT DOCUMENTS

| | | | |
|---|---|---|---|
| 10,235,635 B1* | 3/2019 | Abdo | G06N 10/00 |
| 2018/0054201 A1* | 2/2018 | Reagor | G06N 10/00 |

FOREIGN PATENT DOCUMENTS

JP    2017-073106 A    4/2017

OTHER PUBLICATIONS

Shruti Puri et al., "Quantum annealing with all-to-all connected nonlinear oscillators"; nature Communications; Jun. 8, 2017, pp. 1-9.
Philip Krantz, et al., "Investigation of nonlinear effects in Josephson parametric oscillators used in circuit quantum electrodynamics"; New Journal of Physics, Oct. 7, 2013; vol. 15, 14 pages.

* cited by examiner

*Primary Examiner* — Matthew L Reames
(74) *Attorney, Agent, or Firm* — Sughrue Mion, PLLC

(57) ABSTRACT

A resonator, an oscillator, and a quantum computer capable of preventing oscillation conditions for generating a parametric oscillation from becoming complicated are provided. A resonator includes at least one loop circuit in which a first superconducting line, a first Josephson junction, a second superconducting line, and a second Josephson junction are connected in a ring shape, in which critical current values of the first and second Josephson junctions are different from each other.

15 Claims, 14 Drawing Sheets

RESONATOR, OSCILLATOR, AND QUANTUM COMPUTER

INCORPORATION BY REFERENCE

This application is based upon and claims the benefit of priority from Japanese patent application No. 2019-238374, filed on Dec. 27, 2019, the disclosure of which is incorporated herein in its entirety by reference.

TECHNICAL FIELD

The present disclosure relates to a resonator, an oscillator, and a quantum computer. In particular, the present disclosure relates to a resonator, an oscillator, and a quantum computer using a superconducting circuit.

BACKGROUND ART

A quantum computer using a nonlinear oscillator has been proposed. For example, S. Puri, et al. "Quantum annealing with all-to-all connected nonlinear oscillators," Nature Comm., 2017 (hereinafter referred to as Puri) proposes a quantum computer using a network of nonlinear oscillators. Further, Japanese Unexamined Patent Application Publication No. 2017-73106 proposes a quantum computer using a distributed constant-type Josephson parametric oscillator as a nonlinear oscillator. The Josephson parametric oscillator is an oscillator composed of a superconducting quantum circuit, and includes a superconducting quantum interference device (SQUID: Superconducting QUantum Interference Device) composed of two Josephson junctions.

The Josephson parametric oscillator oscillates by feeding a current having a frequency approximately two times the resonant frequency of the resonator to a circuit that is coupled to the SQUID through mutual inductance and thereby applying an alternating magnetic field to the SQUID. P. Krantz, et. al. "Investigation of nonlinear effects in Josephson parametric oscillators used in circuit quantum electrodynamics", New Journal of Physics, 2013 shows that when the second derivative (the curvature) of the resonance frequency, which is a function of the magnetic field, with respect to the magnetic field is not zero, the following phenomenon occurs. That is, in this case, the actual resonance frequency deviates from the set resonance frequency in proportion to the square of the strength of the magnetic field, so that the frequency of the magnetic field at which an oscillation threshold is minimized deviates from a predetermined frequency (specifically, from a frequency two times the resonance frequency). Further, an upper-limit value is imposed on the strength of the magnetic field for generating an oscillation. Note that the oscillation threshold is the minimum strength of the magnetic field that is required for generating an oscillation.

SUMMARY

In a Josephson parametric oscillator like the one disclosed in Japanese Unexamined Patent Application Publication No. 2017-73106, since the SQUID is formed by using two Josephson junctions having critical current values equal to each other, the second derivative (the curvature) of the resonance frequency with respect to the magnetic field is not zero. Therefore, the above-described phenomenon occurs and hence oscillation conditions for generating a parametric oscillation become complicated. This fact results in a constraint being put on the application of a Josephson parametric oscillator.

An example object of the disclosure is to provide a resonator, an oscillator, and a quantum computer capable of preventing oscillation conditions for generating a parametric oscillation from becoming complicated.

In a first example aspect, a resonator includes at least one loop circuit in which a first superconducting line, a first Josephson junction, a second superconducting line, and a second Josephson junction are connected in a ring shape, in which critical current values of the first and second Josephson junctions are different from each other.

BRIEF DESCRIPTION OF DRAWINGS

The above and other aspects, features and advantages of the present disclosure will become more apparent from the following description of certain example embodiments when taken in conjunction with the accompanying drawings, in which.

EXAMPLE EMBODIMENT

In the following, the details of example embodiments will be described. A resonator described in the example embodiments is obtained by, for example, lines (wiring lines) formed by a superconductor on a silicon substrate. For example, while Nb (niobium) or Al (aluminum) is, for example, used as a material of this line, any other metal such as Mo (molybdenum) or Ta (tantalum) which is in a superconducting state when it is cooled to an extremely low temperature may be used. Further, in order to achieve the superconducting state, a circuit of the resonator is used in a temperature environment such as 10 mK (milli-Kelvin) achieved in a freezer. Further, in the following description, the Josephson junction indicates an element including a structure in which a thin insulating film is sandwiched between a first superconductor and a second superconductor.

First Example Embodiment

Figure 1:
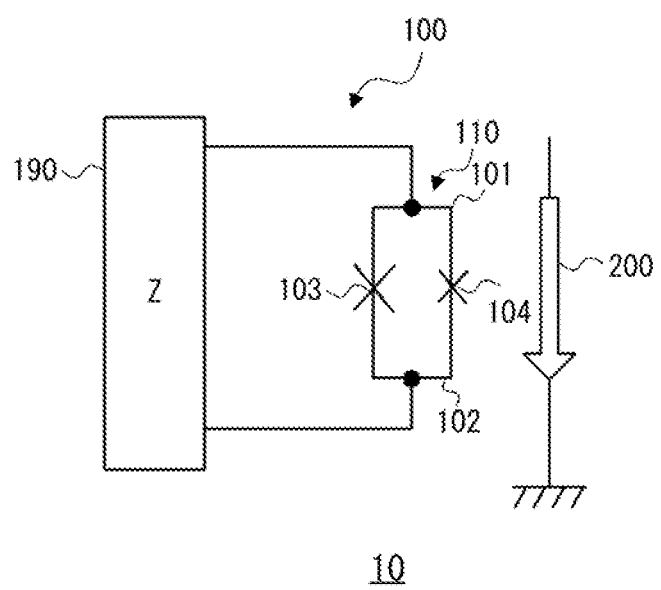
FIG. 1 is a schematic diagram showing an example of an oscillator according to a first example embodiment.

FIG. 1 is a schematic diagram showing an example of an oscillator 10 which is a Josephson parametric oscillator according to a first example embodiment. Hereinafter, the Josephson parametric oscillator is also referred to simply as an oscillator. As shown in FIG. 1, the oscillator 10 includes a resonator 100 and a magnetic field generation unit 200. The resonator 100 includes a loop circuit 110 and an impedance circuit 190 connected to the loop circuit 110. Note that the impedance circuit 190 is an arbitrary circuit that forms, by being connected to the loop circuit 110, a resonator for generating a parametric oscillation. As will be described later, the resonant frequency of the resonator 100 is set (i.e., determined) by a magnetic field applied to the loop circuit 110.

The loop circuit 110 includes a first superconducting line 101 that connects a first Josephson junction 103 and a second Josephson junction 104, and a second superconducting line 102 that connects the first Josephson junction 103 and the second Josephson junction 104. In other words, the resonator 100 includes the loop circuit 110 in which the first superconducting line 101 and the second superconducting line 102 are joined together by the first Josephson junction 103 and the second Josephson junction 104. As shown in FIG. 1, the first superconducting line 101, the first Josephson junction 103, the second superconducting line 102, and the second Josephson junction 104 are connected in a ring shape, thereby forming the loop circuit 110. In other words, in the loop circuit 110, the first superconducting line 101 and the second superconducting line 102 are joined together by the first Josephson junction 103 and the second Josephson junction 104, thereby forming a loop. That is, it can also be said that the loop circuit 110 is a DC-SQUID (Superconducting QUantum Interference Device). Note that the critical current values of the first and second Josephson junctions 103 and 104 are different from each other. That is, the loop circuit 110 is characterized in that it is formed by using two Josephson junctions having critical current values different from each other. In this example embodiment, the ratio between the critical current values of the first and second Josephson junctions 103 and 104 is 1+x: 1−x. Note that x is greater than zero and smaller than one (0<x<1).

The magnetic field generation unit 200 and the resonator 100 (the loop circuit 110) are magnetically coupled with each other through mutual inductance. In other words, the magnetic field generation unit 200 and the resonator 100 (the loop circuit 110) are inductively coupled with each other. The magnetic field generation unit 200 is a circuit that generates an alternating magnetic field and applies the generated alternating magnetic field to the loop circuit 110. The magnetic field generation unit 200 is a circuit through which an AC (Alternating Current) current (hereinafter also referred to as an alternating current) flows, and generates an alternating magnetic field by the alternating current. More specifically, a current in which a DC (Direct Current) current and an alternating current (i.e., an AC current) are superimposed flows through the magnetic field generation unit 200. The frequency of the generated alternating magnetic field is equal to the frequency of this alternating current. The magnitude of the magnetic flux and the height of the oscillation frequency (the resonant frequency) are controlled by the magnitude of the DC current. The resonance frequency of the resonator 100, i.e., the oscillation frequency of the oscillator 10 depends on the equivalent inductance of the loop circuit 110. Further, this equivalent inductance depends on the magnitude of the magnetic flux that passes through the loop of the loop circuit 110. The magnitude of the magnetic flux passing through the loop depends on the magnitude of the DC current flowing through the magnetic field generation unit 200. Therefore, as described above, the height of the oscillation frequency (the resonant frequency) is controlled by the magnitude of the DC current. However, since the alternating current (i.e., the AC current) also flows through the magnetic field generation unit 200 in addition to the DC current, the magnitude of the magnetic flux passing through the loop and the height of the oscillation frequency (the resonant frequency) periodically fluctuate according to the magnitude of the alternating current. Note that although the magnetic field generation unit 200 is represented by one wiring line in FIG. 1, it may be formed by two wiring lines, and may be configured so that the DC current flows through one of the wiring lines and the alternating current flows through the other wiring line.

When an alternating current is fed to the magnetic field generation unit 200 so that an alternating magnetic field whose frequency is two times the resonant frequency of the resonator 100 is applied to the loop circuit 110, the oscillator 10 oscillates at this resonant frequency (i.e., the oscillation frequency 0.5 times (i.e., a half of) the frequency of the alternating magnetic field). This oscillation is called a parametric oscillation. Note that the parametric oscillation may be generated even when an alternating magnetic field whose frequency deviates from the value two times the resonance frequency is applied to the loop circuit.

Figure 2:
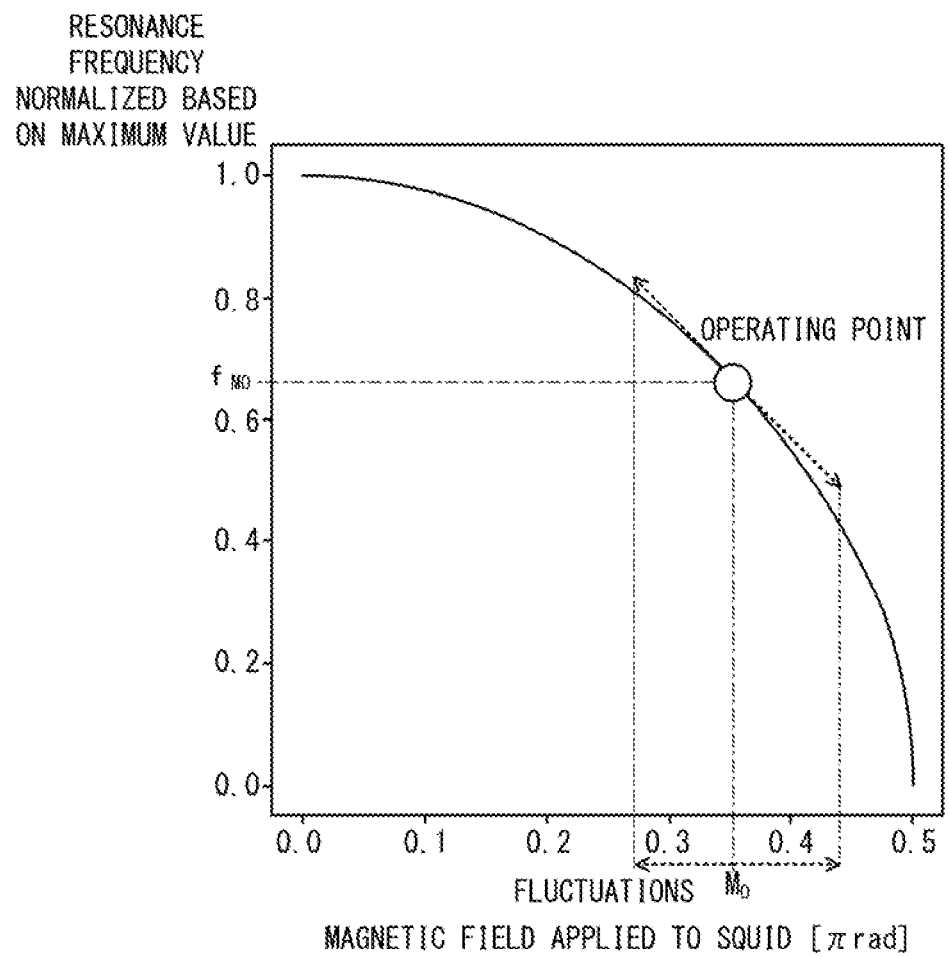
FIG. 2 is a graph showing the dependence of the resonance frequency of a resonator on the magnetic field when the resonator is formed by using a loop circuit according to a comparative example.

As described above, the resonant frequency of the resonator 100 changes according to the magnitude of the magnetic field applied to the loop circuit 110. In other words, the resonant frequency is expressed as a function of the magnetic field. Detailed explanation about this will be given hereinafter. FIG. 2 is a graph showing the dependence of the resonance frequency of a resonator on the magnetic field (hereinafter also expressed as the magnetic-field dependence of the resonance frequency of a resonator) when the resonator is formed by using a loop circuit according to a comparative example. That is, FIG. 2 is a graph showing a function of the magnetic-field dependence of the resonance frequency of the resonator according to the comparative example. In the graph shown in FIG. 2, a horizontal axis indicates the magnitude of the magnetic field applied to the loop circuit (the DC-SQUID), and a vertical axis indicates the height of the resonance frequency. Note that the vertical axis is normalized based on the maximum value of the resonance frequency. Note that, specifically, the loop circuit according to the comparative example is a loop circuit (a DC-SQUID) using two Josephson junctions having critical current values equal to each other, instead of using the first and second Josephson junctions 103 and 104 having critical current values different from each other. When two Josephson junctions having critical current values equal to each other are used, the overall critical current value of the loop circuit becomes zero depending on the applied magnetic field. When the overall critical current value of the loop circuit becomes zero, the equivalent inductance of the loop circuit becomes infinite, so that its resonance frequency becomes zero. That is, as shown in FIG. 2, when a magnetic field having a certain strength is applied to the loop circuit, its resonance frequency becomes zero. Further, as shown in FIG. 2, when two Josephson junctions having critical current values equal to each other are used, the magnetic-field dependence of the resonance frequency is expressed by an upwardly convex function. That is, in this case, the second derivative (the curvature) of the resonance frequency with respect to the magnetic field does not become zero (i.e., becomes non-zero).

Figure 3:
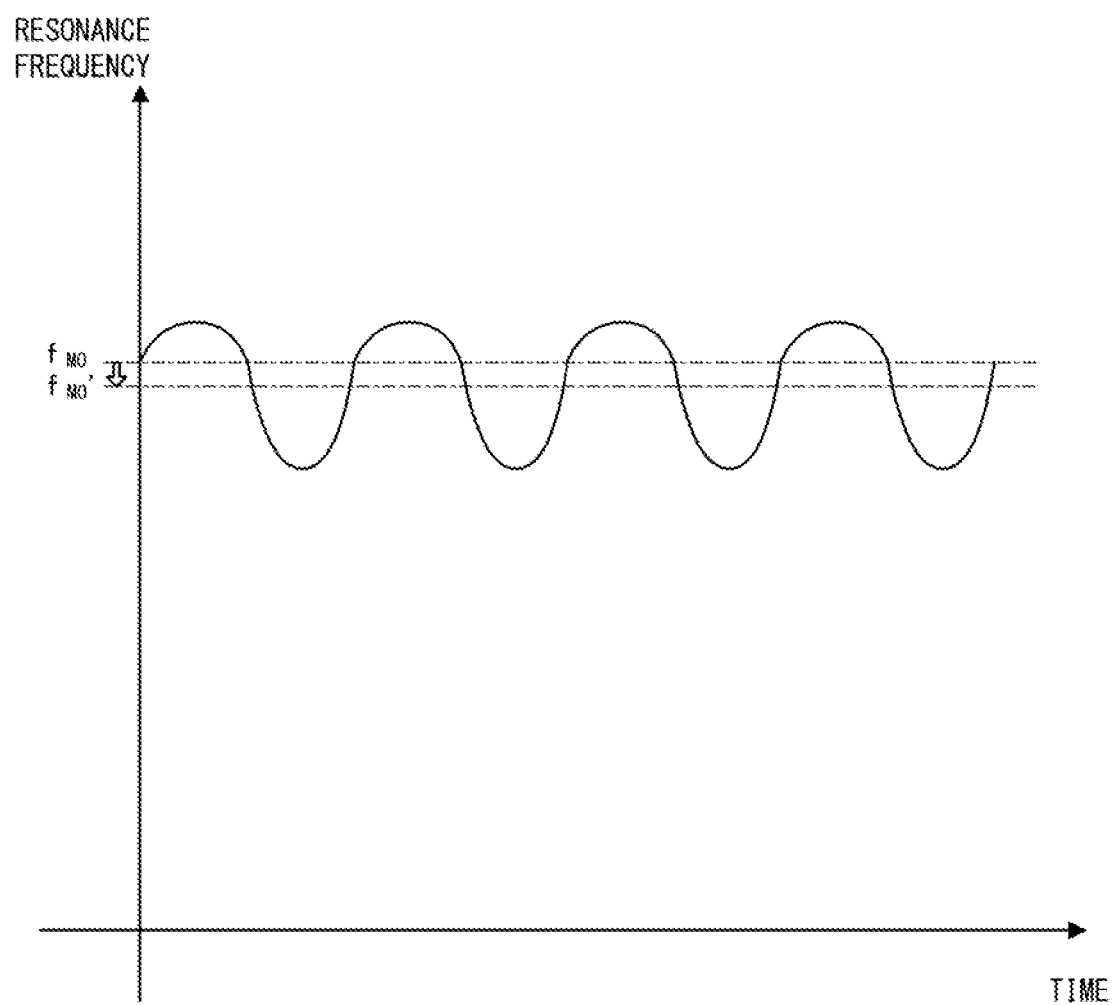
FIG. 3 is a graph showing variations in the resonant frequency according to the comparative example.

Here, assume a case where a magnetic field is applied to the loop circuit according to the comparative example by feeding a DC current and an alternating current (i.e., an AC current) to the magnetic field generation unit 200. A circle plotted in the graph shown in FIG. 2 represents an operating point. The operating point is a point that is defined by the magnitude of the DC current flowing through the magnetic field generation unit 200 on a curve (in a graph) indicating the magnetic-field dependence of the resonance frequency. That is, the operating point indicates the resonant frequency that is set (i.e., determined) by the magnetic field applied by the DC current. As described above, in order to generate a parametric oscillation, it is necessary to feed an alternating current to the magnetic field generation unit 200 and thereby to apply an alternating magnetic field to the loop circuit (the DC-SQUID). Therefore, the magnitude of the applied magnetic field periodically fluctuates around a magnitude Mo of the magnetic field generated by the DC current. As a result, the resonance frequency of the loop circuit also fluctuates. If the waveform of the fluctuations in the resonance frequency becomes a sine wave similar to the waveform of the fluctuations in the magnetic field, an ideal parametric oscillation can be realized. However, when the magnetic-field dependence of the resonance frequency is expressed by an upward convex function, the amount of the fluctuation in the resonance frequency when the magnetic field fluctuates in a direction in which the magnetic field becomes larger than the operating point differs from that when the magnetic field fluctuates in a direction in which the magnetic field becomes smaller than the operating point. Specifically, the amount of decrease in the resonance frequency when the magnetic field fluctuates in the direction in which the magnetic field becomes larger than the operating point is larger than the amount of increase in the resonance frequency when the magnetic field fluctuates in the direction in which the magnetic field becomes smaller than the operating point. FIG. 3 shows this feature. FIG. 3 is a graph showing fluctuations in the resonance frequency according to the comparative example, and schematically shows temporal fluctuations in the resonance frequency of the resonator according to the comparative example. Note that, in FIG. 3, the resonance frequency at the operating point is represented by $f_{M0}$. When the magnetic-field dependence of the resonance frequency is expressed by an upward convex function, the resonance frequency fluctuates while deviating in the decreasing direction, so that the effective resonance frequency becomes a frequency $f_{M0}'$ smaller than the frequency $f_{M0}$. That is, when two Josephson junctions having critical current values equal to each other are used, the effective resonance frequency deviates from the set resonance frequency $f_{M0}$. The amount of this deviation increases as the strength of the applied magnetic field increases. Specifically, the amount of this deviation is proportional to the square of the magnitude of the magnetic field and also proportional to the second-order differential coefficient (the curvature) of the resonance frequency with respect to the magnetic field.

When the ideal parametric oscillation is realized, the oscillation threshold of the parametric oscillation is minimized when the frequency of the magnetic field is equal to a value two times the resonant frequency. Further, the oscillation threshold increases as the frequency of the magnetic field deviates from the value two times the resonant frequency. In other words, when the waveform of the fluctuations in the resonance frequency is a sine wave with no fluctuational deviation, the oscillation threshold of the parametric oscillation is minimized when the frequency of the magnetic field is equal to the value two times the resonance frequency, and increases as the frequency of the magnetic field deviates from the value two times the resonance frequency. However, as described above, when there is a deviation in the fluctuations in the resonance frequency, the actual resonance frequency deviates from the set resonance frequency in proportion to the square of the strength of the magnetic field. Further, as a result, the frequency of the magnetic field at which the oscillation threshold is minimized deviates from the frequency two times the resonance frequency. Further, an upper-limit value is imposed on the strength of the magnetic field for generating an oscillation. Therefore, when there is a deviation in the fluctuations in the resonance frequency, the operating conditions for the parametric oscillation become complicated as compared to when there is no deviation in the fluctuations in the resonance frequency.

Figure 4:
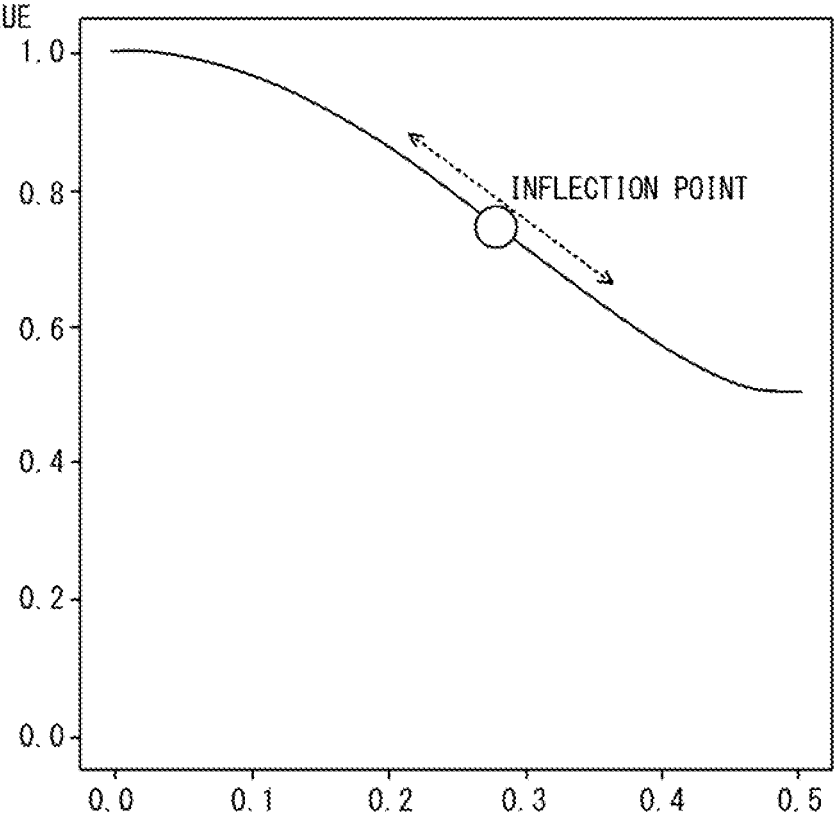
FIG. 4 is a graph showing the dependence of the resonance frequency of a resonator on the magnetic field when the resonator is formed by using a loop circuit according to an example embodiment.

As described above, in this example embodiment, the critical current values of the first and second Josephson junction 103 and 104 constituting the loop circuit 110 are different from each other. FIG. 4 is a graph showing the magnetic-field dependence of the resonance frequency of a resonator when the resonator is formed by using the loop circuit 110 according to an example embodiment. That is, FIG. 4 is a graph showing a function of the magnetic-field dependence of the resonance frequency of the resonator 100. In the graph shown in FIG. 4, a horizontal axis indicates the magnitude of the magnetic field applied to the loop circuit 110 (the DC-SQUID), and a vertical axis indicates the height of the resonance frequency. Note that the vertical axis is normalized based on the maximum value of the resonance frequency. When two Josephson junctions having critical current values different from each other are used, the critical current values of these two Josephson junctions are not canceled out, so that there is a positive lower limit for the overall critical current value of the loop circuit 110 (the DC-SQUID). In this way, there is also a positive lower limit for the resonance frequency when a magnetic field is applied to the loop circuit. Further, when two Josephson junctions having critical current values different from each other are used, as shown in FIG. 4, the function of the magnetic-field dependence of the resonance frequency becomes continuous and smooth even when the overall critical current value of the loop circuit 110 has the lower-limit value (even when the resonance frequency is minimized). Further, since this function has an upwardly convex shape when the overall critical current value of the loop circuit 110 has the upper-limit value and has a downwardly convex shape when the overall critical current has the lower-limit value, there is always an inflection point (a circle plotted in the graph shown in FIG. 4) at which the curvature of the magnetic-field dependence of the resonance frequency becomes zero. That is, there is a point where the value of the second derivative (the curvature) of the resonance frequency with respect to the magnetic field becomes zero.

When the magnetic field fluctuates around the magnitude of the magnetic field corresponding to the inflection point, no deviation occurs in the fluctuations in the resonance frequency. Therefore, it is possible to prevent the operating conditions for the parametric oscillation from becoming complicated. For example, an ideal parametric oscillation is realized by calculating the magnitude of the magnetic field corresponding to the inflection point through numerical calculation, and feeding a DC current by which the magnetic field having the calculated magnitude is generated to the magnetic field generation unit 200. Note that the operating point is preferably equal to the inflection point, but does not necessarily have to be equal to the inflection point. The reason for this is as follows. The amount of the deviation of the effective resonance frequency is also proportional to the second-order differential coefficient (the curvature) of the function of the magnetic-field dependence of the resonance frequency as described above. Therefore, it is possible, by using an operating point having a smaller curvature, to prevent the operating conditions for the parametric oscillation from becoming complicated. Since the second-order differential coefficient (the curvature) becomes zero at the inflection point, the value of the second-order differential coefficient (the curvature) is close to zero near the inflection point. Therefore, it is possible to prevent the operating conditions for the parametric oscillation from becoming complicated even when a point near the inflection point is used as the operating point. As described above, it is possible, by forming a resonator including a DC-SQUID using two Josephson junctions having critical current values different from each other, to obtain an operating point with which the operating conditions for the parametric oscillation can be prevented from becoming complicated as compared to the case where Josephson junctions having critical current values equal to each other are used.

The ratio between the critical current values of the first and second Josephson junction 103 and 104 is examined hereinafter. That is, the value of the above-described x (0<x<1) is examined. The critical current value of the first Josephson junction 103 is represented by $I_0(1+x)$, and that of the second Josephson junction 104 is represented by $I_0(1-x)$. Note that $I_0$ is the average value of the critical current values of the first and second Josephson junction 103 and 104. The critical current value of the loop circuit 110 (the DC-SQUID) is expressed as $2I_0(\cos^2\theta + x^2 \sin^2\theta)$. Note that $\theta$ represents the phase of the magnetic field which is obtained by dividing the magnetic field applied to the loop circuit 110 by the flux quantum $\Phi_0$. Since x is smaller than one (x<1), the critical current value of loop circuit 110 is maximized when the phase of the magnetic field is equal to a multiple of $\pi$, and is minimized when the phase is $\pi/2$ away therefrom. The minimum value is equal to a value obtained by multiplying the maximum value by $x^2$. Note that when the two Josephson junctions have critical current values equal to each other, i.e., when x is zero (x=0), the minimum value of the critical current value becomes zero.

Since the nonlinear inductance of the loop circuit 110 is inversely proportional to the critical current value of the loop circuit 110, the resonance frequency of the Josephson parametric oscillator (the oscillator 10) is maximized in the magnetic field in which the critical current value of the loop circuit 110 is maximized. This maximum value of the resonance frequency is represented by $f_{max}$. Similarly, the resonance frequency of the Josephson parametric oscillator (the oscillator 10) is minimized in the magnetic field in which the critical current value of the loop circuit 110 is minimized. This minimum value of the resonance frequency is represented by $f_{min}$. When x is greater than zero and smaller than one (0<x<1), the resonant frequency becomes a continuous and smooth function of the magnetic field. Further, since the inflection point is located between the minimum value $f_{min}$ and the maximum value $f_{max}$, the operating conditions for the parametric oscillation can be prevented from becoming complicated. However, in order to make the oscillator function as a Josephson parametric oscillator, it is preferable that x satisfy the following two requirements.

Figure 5:
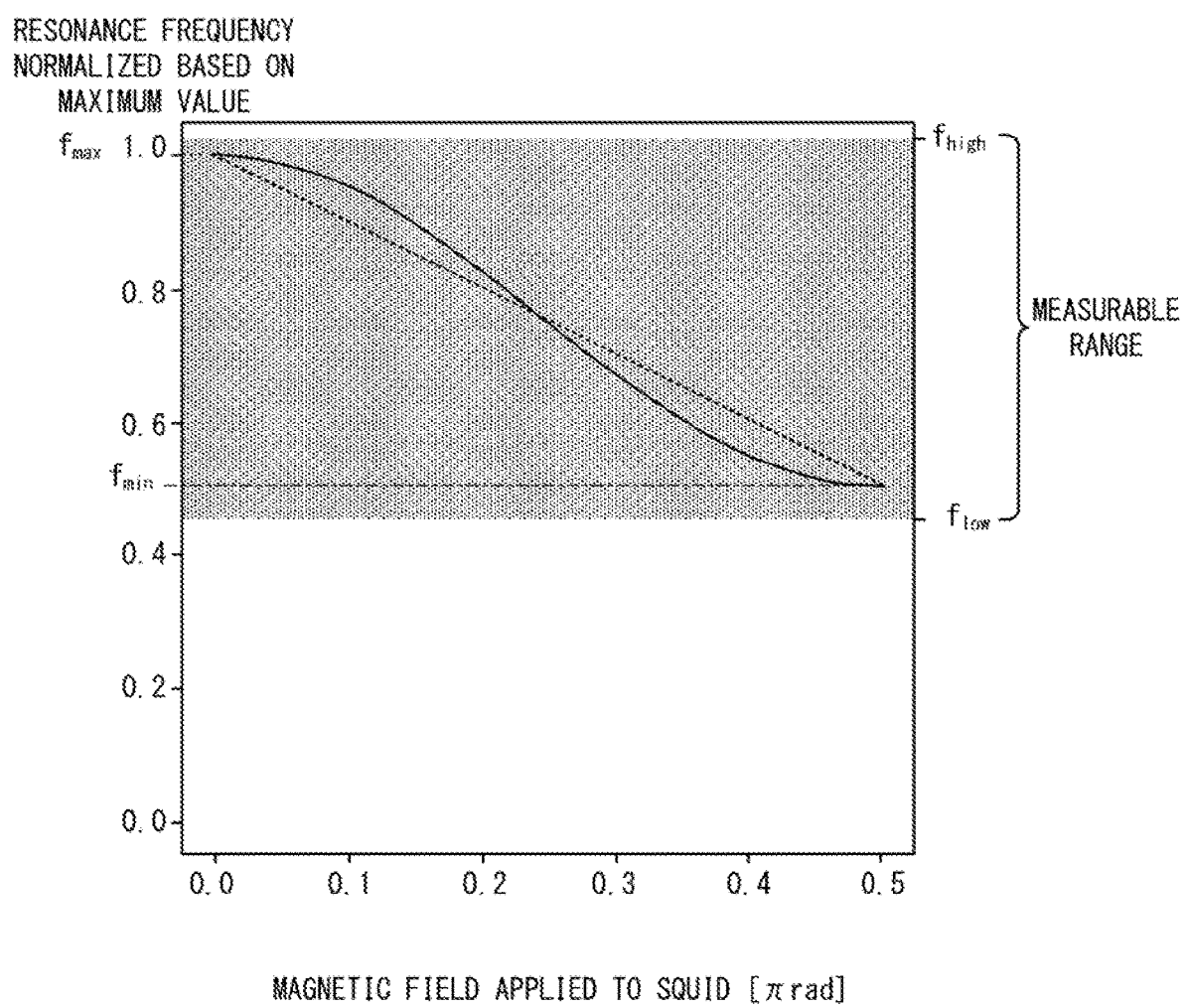
FIG. 5 is a graph for explaining the slope of a function of the dependence of the resonance frequency on the magnetic field.

Firstly, in order to excite the Josephson parametric oscillator, the magnitude of the slope of the function of the magnetic-field dependence of the resonance frequency of the Josephson parametric oscillator (the resonator 100) needs to be equal to or larger than a certain value. Note that the required magnitude of the slope is represented by g (g>0). Note that the magnitude g depends on the magnitude of the alternating current that can be fed to the magnetic field generation unit 200 and the speed at which the current leaks from the resonator 100, and is a value determined by the configuration of the oscillator 10. Further, the magnetic field corresponding to the phase $\pi/2$ is represented by $\Phi_{\pi/2}$. Since the average magnitude of the slope of the resonance frequency (a broken line in the graph shown in FIG. 5) is expressed as $(f_{max}-f_{min})/\Phi_{\pi/2}$, the above-described condition can be expressed as $g<(f_{max}-f_{min})/\Phi_{\pi/2}$. As x approaches one, the average slope of the resonant frequency (the broken line in the graph shown in FIG. 5) approaches zero. Therefore, the upper limit of x is determined by the above-described condition. Therefore, it is preferable that the value of x be such a value that the slope from the maximum value of the resonance frequency to the minimum value thereof in the function of the magnetic-field dependence of the resonance frequency of the resonator 100 becomes larger than the predetermined value g.

Secondly, since the measurement of the Josephson parametric oscillator (the oscillator 10) is often carried out by using a bandpass filter or the like in order to reduce environmental noises, the inflection point needs to be located within the measurable range. When the frequency band of the measurable range is represented by $[f_{low}, f_{high}]$, if relations $f_{low}<f_{min}$ and $f_{max}<f_{high}$ hold, the inflection point is always included in the measurable range. Since $f_{min}$ approaches zero when x approaches zero, the lower limit of x is determined by the above-described condition. Therefore, it is preferable that the value of x be such a value that the minimum value of the resonance frequency in the function of the magnetic-field dependence of the resonance frequency of the resonator 100 falls within the frequency band required for the measurement of the output from the resonator 100. Based on the above-described examination, the value of x may be, for example, a value no smaller than 0.1 and no greater than 0.2.

Second Example Embodiment

Figure 6:
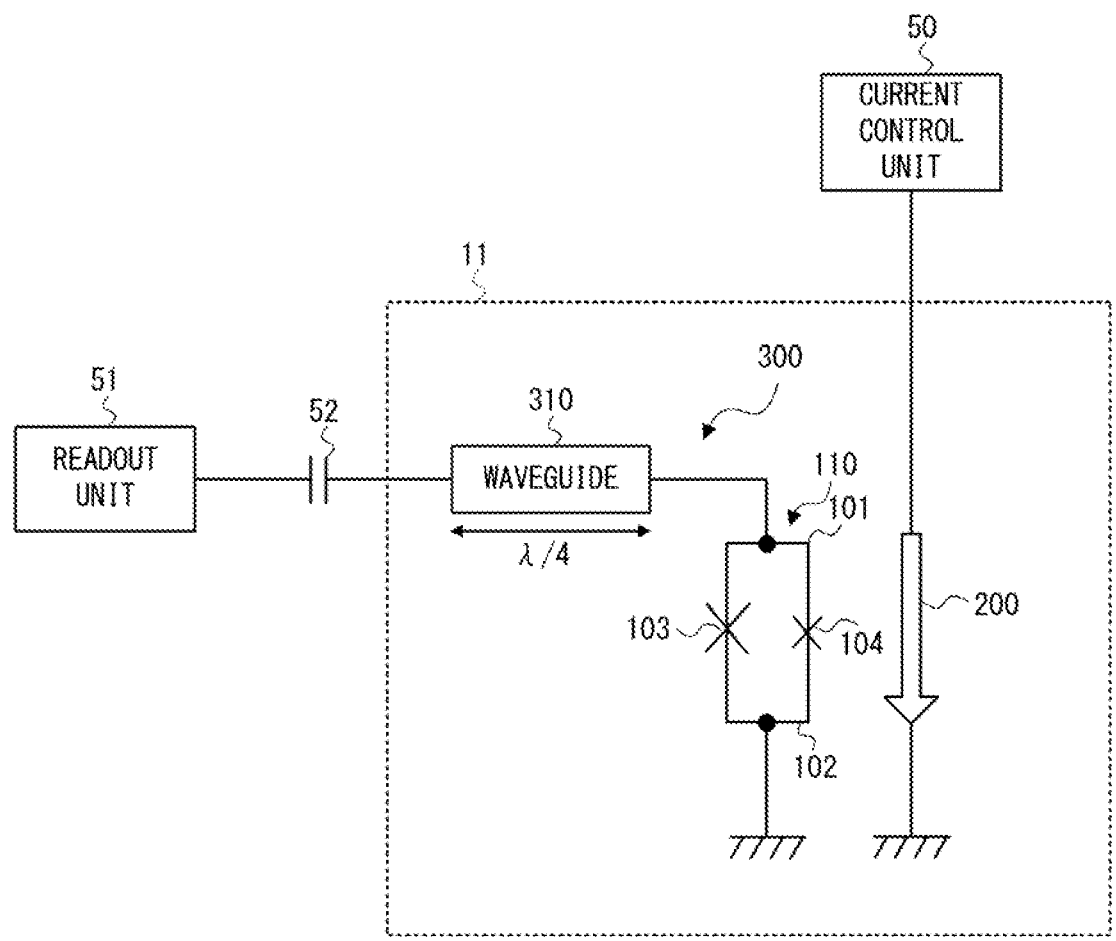
FIG. 6 is a schematic diagram showing an example of a configuration of an oscillation apparatus according to a second example embodiment.
Figure 7:
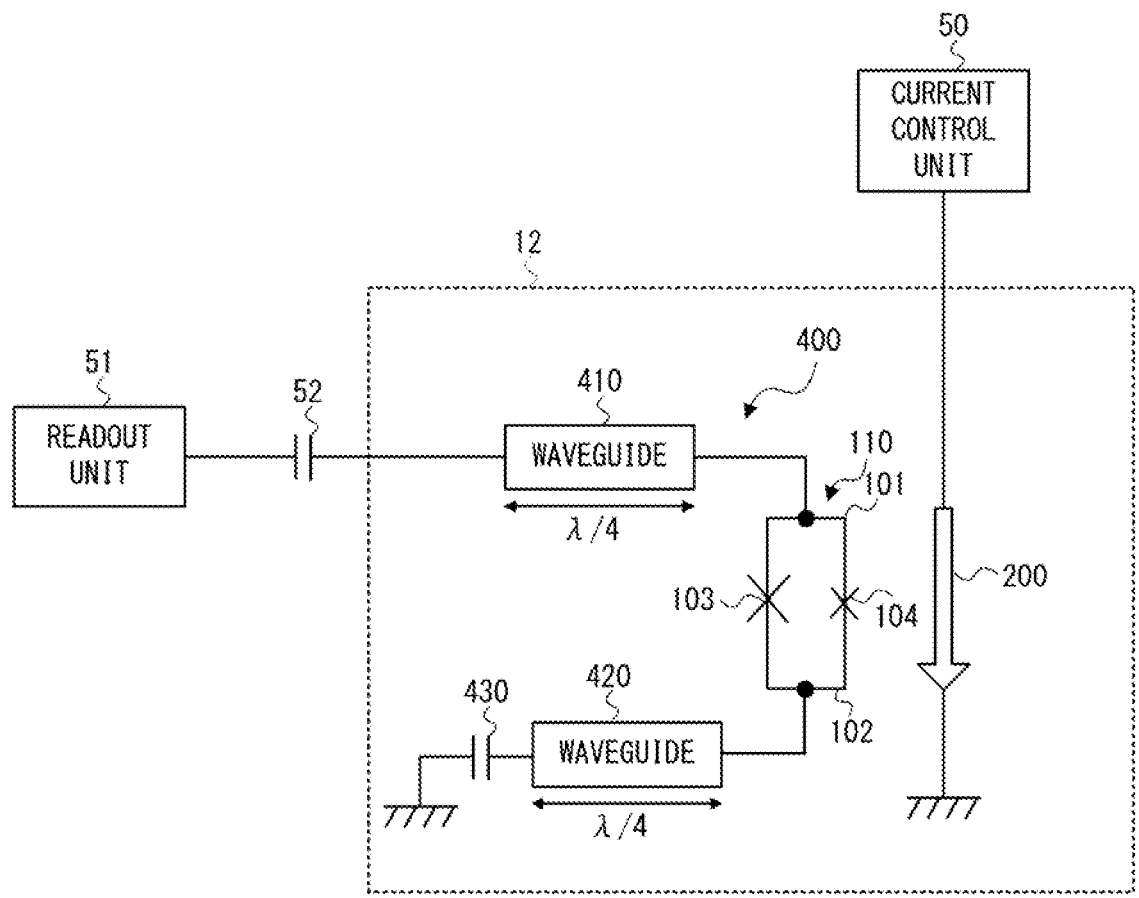
FIG. 7 is a schematic diagram showing an example of a configuration of an oscillation apparatus according to the second example embodiment.

As a second example embodiment, a distributed constant-type Josephson parametric oscillator will be described. FIGS. 6 and 7 are schematic diagrams showing examples of the configuration of an oscillation apparatus including a distributed constant-type Josephson parametric oscillator. An oscillation apparatus 1 shown in FIG. 6 includes an oscillator 11 which is a distributed constant-type Josephson parametric oscillator, a current control unit 50, a readout unit 51, and an input/output capacitor 52. Similarly, an oscillation apparatus 2 shown in FIG. 7 includes an oscillator 12 which is a distributed constant-type Josephson parametric oscillator, a current control unit 50, a readout unit 51, and an input/output capacitor 52.

The oscillator 11 (see FIG. 6) includes a resonator 300 and the above-described magnetic field generation unit 200. The magnetic field generation unit 200 and the resonator 300 are magnetically coupled with each other through mutual inductance. In other words, the magnetic field generation unit 200 and the resonator 300 are inductively coupled with each other. The resonator 300 includes the above-described loop circuit 110 including two Josephson junctions having critical current values different from each other, and a waveguide 310. The resonance frequency of the resonator 300 is also set (i.e., determined) by the magnetic field applied to the loop circuit 110. The waveguide 310 is a waveguide having a length corresponding to ¼ times (i.e., a quarter of) the wavelength of a standing wave that occurs when the oscillator 11 oscillates. In the oscillator 11, one end of the loop circuit 110 (a first superconducting line 101) is connected in series with the waveguide 310, and the other end thereof (a second superconducting line 102) is connected to the ground. One end of the waveguide 310 is connected in series with the loop circuit 110, and the other end thereof is connected in series with the input/output capacitor 52.

The oscillator 12 (see FIG. 7) includes a resonator 400 and the above-described magnetic field generation unit 200. The magnetic field generation unit 200 and the resonator 400 are magnetically coupled with each other through mutual inductance. In other words, the magnetic field generation unit 200 and the resonator 400 are inductively coupled with each other. The resonator 400 includes the above-described loop circuit 110 including two Josephson junctions having critical current values different from each other, a waveguide 410, a waveguide 420, and a capacitor 430. The resonance frequency of the resonator 400 is also set (i.e., determined) by the magnetic field applied to the loop circuit 110. Each of the waveguides 410 and 420 has a length corresponding to ¼ times (i.e., a quarter of) the wavelength of the standing wave that occurs when the oscillator 12 oscillates. In the oscillator 12, the waveguide 410, the loop circuit 110, the waveguide 420, and the capacitor 430 are connected in series with one another in this order. That is, one end of the loop circuit 110 (a first superconducting line 101) is connected in series with the waveguide 410, and the other end thereof (a second superconducting line 102) is connected in series with the waveguide 420. One end of the waveguide 410 is connected in series with the loop circuit 110, and the other end thereof is connected in series with the input/output capacitor 52. One end of the waveguide 420 is connected in series with the loop circuit 110, and the other end thereof is connected to the ground through the capacitor 430.

The current control unit 50 is a circuit connected to the magnetic field generation unit 200 and supplies a DC current for controlling the oscillation frequency (the resonant frequency) of the oscillator 11 or 12 and an alternating current (i.e., an AC current) for oscillating the oscillator 11 or 12 to the magnetic field generation unit 200. The readout unit 51 is a circuit connected to the resonator 300 or 400 through the input/output capacitor 52, and reads out an internal state, i.e., an oscillation state, of the oscillator 11 or 12.

As described above, it is possible, by forming a resonator including a waveguide (specifically, a waveguide having a length corresponding to a value that is obtained by multiplying the wavelength of the standing wave that occurs during the oscillation by a fraction) connected in series with the loop circuit 110, to realize a distributed constant-type Josephson parametric oscillator. As described above, the loop circuit 110 is composed of two Josephson junctions having critical current values different from each other. Therefore, according to the above-described configuration, it is possible to realize a distributed constant-type Josephson parametric oscillator in which the operating conditions for the parametric oscillation is prevented from becoming complicated.

Third Example Embodiment

As a third example embodiment, a lumped constant-type Josephson parametric oscillator will be described. The distributed constant-type Josephson parametric oscillator is not suitable for the integration because the occupied area of the resonator is too large. In contrast to this, since the lumped constant-type Josephson parametric oscillator does not require a waveguide, it can be formed in a smaller size than that of the distributed constant-type Josephson parametric oscillator.

Figure 8:
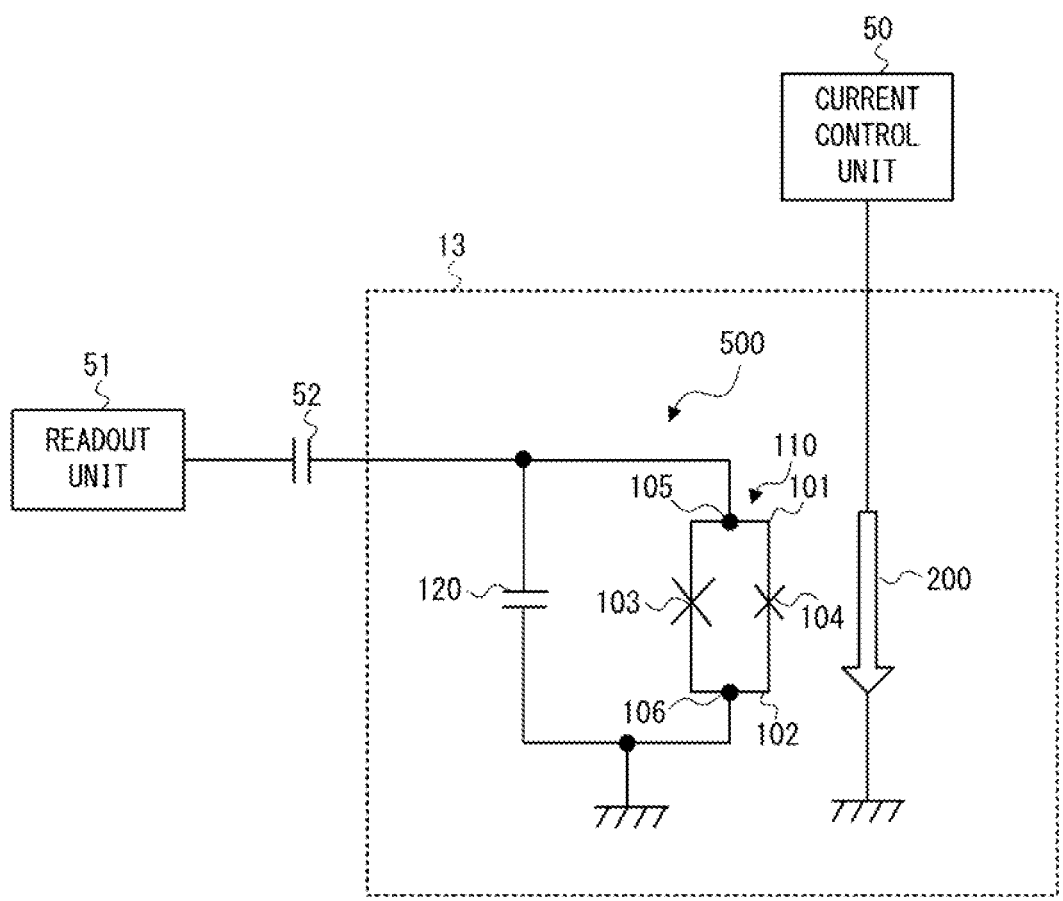
FIG. 8 is a schematic diagram showing an example of a configuration of an oscillation apparatus according to a third example embodiment.

FIG. 8 is a schematic diagram showing an example of a configuration of an oscillation apparatus including a lumped constant-type Josephson parametric oscillator. An oscillation apparatus 3 shown in FIG. 8 is different from that shown in FIG. 6 or FIG. 7 because the distributed constant-type oscillator is replaced by a lumped constant-type oscillator 13. That is, the oscillation apparatus 3 includes an oscillator 13 which is a lumped constant-type Josephson parametric oscillator, a current control unit 50, a readout unit 51, and an input/output capacitor 52.

The oscillator 13 includes a resonator 500 and the above-described magnetic field generation unit 200. The resonator 500 differs from that shown in FIG. 6 or FIG. 7 because the distributed constant-type resonator is replaced by a lumped constant-type resonator 500. The magnetic field generation unit 200 and the resonator 500 are magnetically coupled with each other through mutual inductance. In other words, the magnetic field generation unit 200 and the resonator 500 are inductively coupled with each other. The resonator 500 includes the above-described loop circuit 110 including two Josephson junctions having critical current values different from each other, and a capacitor 120. The resonance frequency of the resonator 500 is also set (i.e., determined) by the magnetic field applied to the loop circuit 110.

The loop circuit 110 is shunted by the capacitor 120. That is, a first part 105 of the first superconducting line 101 and a second part 106 of the second superconducting line 102 are shunted by the capacitor 120. In other words, in the resonator 500, the input/output ends of the DC-SQUID are shunted by the capacitor 120. That is, it can be said that, by connecting the capacitor 120 and the loop circuit 110 in a ring shape, a loop circuit in which the loop circuit 110 is incorporated on the line of the loop is formed. Note that, in the following description, a circuit for shunting is also referred to as a shunt circuit. Note that the first part 105 is an arbitrary part of the first superconducting line 101. That is, the position of the first part 105 in the first superconducting line 101 is not limited to any particular places. Similarly, the second part 106 is an arbitrary part of the second superconducting line 102. That is, the position of the second part 106 in the second superconducting line 102 is not limited to any particular places. Note that as shown in FIG. 8, one end of the loop circuit may be connected to the ground.

The current control unit 50 is a circuit connected to the magnetic field generation unit 200, and supplies a DC current for controlling the oscillation frequency (the resonant frequency) of the oscillator 13 and an alternating current for oscillating the oscillator 13 to the magnetic field generation unit 200. The readout unit 51 is a circuit connected to the resonator 500 through the input/output capacitor 52, and reads out an internal state, i.e., an oscillation state, of the oscillator 13. Note that in the configuration shown in FIG. 8, the readout unit 51 is connected to the shunt circuit (the circuit that shunts the loop circuit 110) through the input/output capacitor 52.

As described above, it is possible, by forming a resonator in which the loop circuit 110 and the capacitor 120 are connected in a ring shape, to realize a lumped constant-type Josephson parametric oscillator. As described above, the loop circuit 110 is composed of two Josephson junctions having critical current values different from each other. Therefore, according to the above-described configuration, it is possible to realize a lumped constant-type Josephson parametric oscillator in which the operating conditions for the parametric oscillation is prevented from becoming complicated.

Although the lumped constant-type Josephson parametric oscillator has been described above, the specific configuration of the Josephson parametric oscillator is not limited to the above-described configuration. Other configurations of the Josephson parametric oscillator that can be applied to this example embodiment will be described hereinafter.

It is possible to use the oscillator 13 shown in FIG. 8 in a quantum computer. However, in such a case, in some cases, the nonlinearity of the oscillator 13 may be too large to obtain a desired performance in the quantum computer. To provide a quantum computer having better performance, a Josephson parametric oscillator used for the quantum computer needs to have moderate nonlinearity. Note that the nonlinearity of a Josephson parametric oscillator is quantified (or quantitatively indicated) by a nonlinearity coefficient. The nonlinearity coefficient is a coefficient defined by a coefficient of a nonlinear term of a Hamiltonian of a Josephson parametric oscillator (a resonator).

The nonlinearity coefficient of the oscillator 13 shown in FIG. 8 includes, except for physical constants, only the capacitance of the capacitor 120 as a variable. Therefore, the nonlinearity of the oscillator 13 depends on the magnitude of the capacitance of the capacitor 120. In this case, it is possible to lower the magnitude (the absolute value) of the nonlinearity coefficient of the oscillator by increasing the capacitance of the capacitor 120. However, when the capacitance of the capacitor 120 is increased, the loss of the oscillator increases. This is because, in order to produce a large capacitance in a sufficiently small area suitable for an integrated circuit, it is necessary to use a capacitor having a laminated structure. However, for the capacitor having a laminated structure, it is difficult to manufacture a dielectric layer having a small loss by using the existing technology. Note that the dielectric layer is a layer of a dielectric material formed between two electrodes of a capacitor.

Therefore, as a modified example of the above-described third example embodiment, a configuration of an oscillator capable of achieving both appropriate nonlinearity and a low loss will be described hereinafter in detail. Note that in the following description, the same reference numerals are used for the same components that are already described above and detailed descriptions thereof are omitted as appropriate.

First and second modified examples described hereinafter are in common to each other in that the loop circuit 110 is shunted by a capacitor and a linear inductor. However, in the first modified example, the capacitor and the linear inductor, which are used for the shunting, are connected in series with each other. In contrast to this, in the second modified example, the capacitor and the linear inductor, which are used for the shunting, are connected in parallel with each other.

First Modified Example

Figure 9:
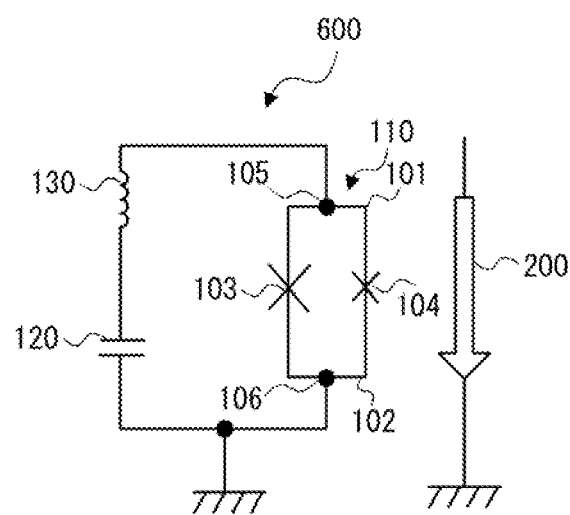
FIG. 9 is a schematic diagram showing a configuration of a Josephson parametric oscillator according to a first modified example.

FIG. 9 is a schematic diagram showing a configuration of a Josephson parametric oscillator according to the first modified example. As shown in FIG. 9, an oscillator 14 includes a resonator 600 and a magnetic field generation unit 200. The magnetic field generation unit 200 and the resonator 600 are magnetically coupled with each other through mutual inductance. In other words, the magnetic field generation unit 200 and the resonator 600 are inductively coupled with each other. The resonator 600 includes the above-described loop circuit 110 including two Josephson junctions having critical current values different from each other, a capacitor 120, and a linear inductor 130. The resonance frequency of the resonator 600 is also set (i.e., determined) by the magnetic field applied to the loop circuit 110.

In the resonator 600, the loop circuit 110 is shunted by a circuit in which the capacitor 120 and the linear inductor 130 are connected in series with each other. That is, the first part 105 of the first superconducting line 101 and the second part 106 of the second superconducting line 102 are shunted by the capacitor 120 and the linear inductor 130 connected in series with each other. In other words, in the resonator 600, the input/output ends of the DC-SQUID are shunted by the capacitor 120 and the linear inductor 130 connected in series with each other. That is, it can be said that, by connecting the series circuit composed of the capacitor 120 and the linear inductor 130 with the loop circuit 110 in a ring shape, a loop circuit in which the loop circuit 110 is incorporated on the line of the loop is formed. Note that as shown in FIG. 9, one end of the loop circuit may be connected to the ground.

The nonlinearity coefficient of the oscillator 14 shown in FIG. 9 includes, as a variable, the inductance of the linear inductor 130 in addition to the physical constants. Further, it is possible to lower the magnitude of the nonlinearity coefficient of the oscillator 14 by increasing the inductance of the linear inductor 130. As described above, according to this modified example, it is possible to lower the magnitude of the nonlinearity coefficient not by the capacitor 120 but by the linear inductor 130. Therefore, it is possible to lower the magnitude of the nonlinearity coefficient of the oscillator to an appropriate value required for a quantum computer without increasing the loss of the oscillator.

Note that the value of the inductance of the linear inductor 130 is set in advance so that the value of the nonlinearity coefficient of the Hamiltonian of the resonator 600 becomes a predetermined value. That is, the linear inductor 130 is designed so that its inductance is not a floating inductance but has a predetermined value. In other words, the linear inductor 130 is an inductor that exists as a non-floating component. For example, the linear inductor 130 may be provided as a meander wiring line or as a coil, but how to provide (or form) the linear inductor 130 is not limited to these examples.

Second Modified Example

Next, a second modified example will be described. In the first modified example, the capacitor and the linear inductor, which are used for the shunting, are connected in series with each other. In contrast, in the second modified example, the capacitor and the linear inductor, which are used for the shunting, are connected in parallel with each other.

Figure 10:
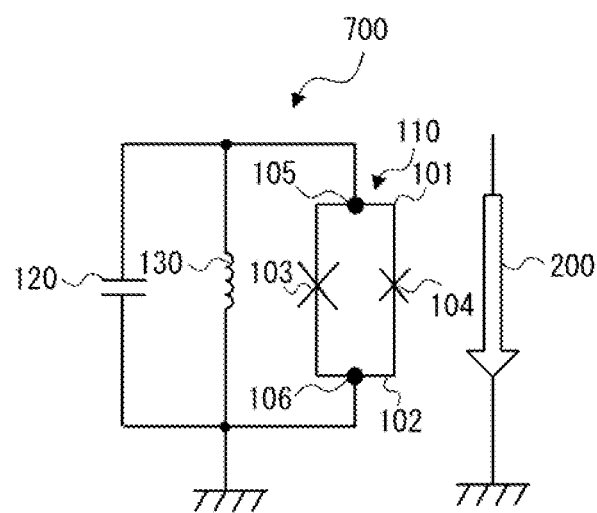
FIG. 10 is a schematic diagram showing a configuration of a Josephson parametric oscillator according to a second modified example.

FIG. 10 is a schematic diagram showing a configuration of a Josephson parametric oscillator according to the second modified example. As shown in FIG. 10, an oscillator 15 includes a resonator 700 and a magnetic field generation unit 200. The magnetic field generation unit 200 and the resonator 700 are magnetically coupled with each other through mutual inductance. In other words, the magnetic field generation unit 200 and the resonator 700 are inductively coupled with each other. The resonator 700 includes the above-described loop circuit 110 including two Josephson junctions having critical current values different from each other, a capacitor 120, and a linear inductor 130. The resonance frequency of the resonator 700 is also set (i.e., determined) by the magnetic field applied to the loop circuit 110.

In the resonator 700, the loop circuit 110 is shunted by a circuit in which the capacitor 120 and the linear inductor 130 are connected in parallel with each other. That is, the first part 105 of the first superconducting line 101 and the second part 106 of the second superconducting line 102 are shunted by the capacitor 120 and the linear inductor 130 connected in parallel with each other. In other words, in the resonator 700, the input/output ends of the DC-SQUID are shunted by the capacitor 120 and the linear inductor 130 connected in parallel to each other. That is, it can be said that, by connecting the parallel circuit composed of the capacitor 120 and the linear inductor 130 with the loop circuit 110 in a ring shape, a loop circuit in which the loop circuit 110 is incorporated on the line of the loop is formed. Note that as shown in FIG. 10, one end of the loop circuit may be connected to the ground.

The nonlinearity coefficient of the oscillator 15 shown in FIG. 10 includes, as a variable, the inductance of the linear inductor 130 in addition to the physical constants. Further, it is possible to lower the magnitude of the nonlinearity coefficient of the oscillator 15 by reducing the inductance of the linear inductor 130. As described above, according to this modified example, it is also possible to lower the magnitude of the nonlinearity coefficient not by the capacitor 120 but by the linear inductor 130. Therefore, it is possible to lower the magnitude of the nonlinearity coefficient of the oscillator to an appropriate value required for a quantum computer without increasing the loss of the oscillator. Note that in this modified example, the value of the inductance of the linear inductor 130 is also set in advance so that the value of the nonlinearity coefficient of the Hamiltonian of the resonator 700 becomes a predetermined value. That is, the linear inductor 130 is designed so that its inductance is not a floating inductance but has a predetermined value. In other words, the linear inductor 130 is an inductor that exists as a non-floating component.

Third Modified Example

Figure 11:
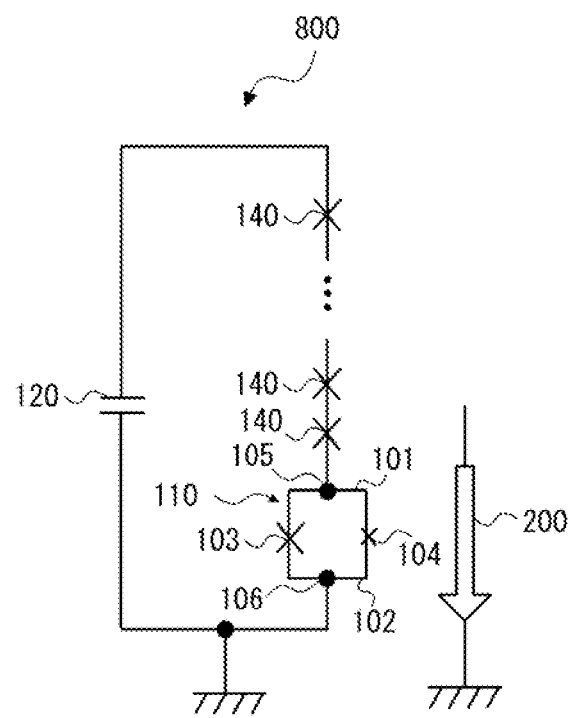
FIG. 11 is a schematic diagram showing an example of a Josephson parametric oscillator according to a third modified example.

Next, a third modified example will be described. FIG. 11 is a schematic diagram showing an example of a Josephson parametric oscillator according to the third modified example. As shown in FIG. 11, an oscillator 16 includes a resonator 800 and a magnetic field generation unit 200. The magnetic field generation unit 200 and the resonator 800 are magnetically coupled with each other through mutual inductance. In other words, the magnetic field generation unit 200 and the resonator 800 are inductively coupled with each other. The resonator 800 includes the above-described loop circuit 110 including two Josephson junctions having critical current values different from each other, Josephson junctions 140, and a capacitor 120. The resonance frequency of the resonator 800 is also set (i.e., determined) by the magnetic field applied to the loop circuit 110. In this modified example, the resonator 800 includes one loop circuit 110. However, as shown in a later-described modified example, the resonator 800 may include a plurality of loop circuits 110.

The Josephson junctions 140 are those provided separately from the Josephson junctions 103 and 104 included in the loop circuit 110. The resonator 800 includes at least one Josephson junction 140. In other words, the resonator 800 may include a plurality of Josephson junctions 140. The Josephson junctions 140 and the loop circuit 110 are connected in series with each other. Note that although a plurality of Josephson junctions 140 are connected in series with one another as a group of junctions (i.e., connected in series with each other in one place) in FIG. 11, the order of the arrangement of these junctions may be arbitrarily determined. Therefore, for example, the loop circuit 110 and the Josephson junctions 140 may be connected in series so that they are arranged in an alternate manner. In the loop circuit 110, a first part 105 in the first superconducting line 101 and a second part 106 in the second superconducting line 102 are used for this series connection. That is, the first and second parts 105 and 106 serve as connection points in the series connection. Further, in the Josephson junctions 140, both terminals of the Josephson junctions 140 serve as connection points in the series connection.

A circuit in which the loop circuit 110 and the Josephson junctions 140 are connected in series with one another is shunted by the capacitor 120. That is, it can be said that, by connecting the loop circuit 110, the Josephson junctions 140, and the capacitor 120 in a ring shape, a loop circuit in which the loop circuit 110 is incorporated on the line of the loop is formed. Note that as shown in FIG. 11, the loop circuit in which the loop circuit 110, the Josephson junctions 140, and the capacitor 120 are connected in a ring shape may be connected to the ground.

The nonlinearity coefficient of the oscillator 16 shown in FIG. 11 includes, as a variable, the number of Josephson junctions 140 included in the resonator 800 in addition to the physical constant. Further, it is possible to lower the magnitude of the nonlinearity coefficient of the oscillator 16 by increasing the number of Josephson junctions 140. That is, it is possible to lower the magnitude of the nonlinearity coefficient according to the number of Josephson junctions 140.

As described above, in this modified example, the resonator is not formed by the ring-shaped circuit composed solely of the loop circuit 110 and the capacitor 120, but is formed by the circuit in which the loop circuit 110, the Josephson junctions 140, and the capacitor 120 are connected in a ring shape. In this way, as described above, it is possible to arbitrarily design (i.e., determine) the nonlinearity of the oscillator 16 based on the number of Josephson junctions 140. That is, it is possible to lower the magnitude of the nonlinearity coefficient to an appropriate value required for a quantum computer without increasing the loss of the oscillator.

Fourth Modified Example

Figure 12:
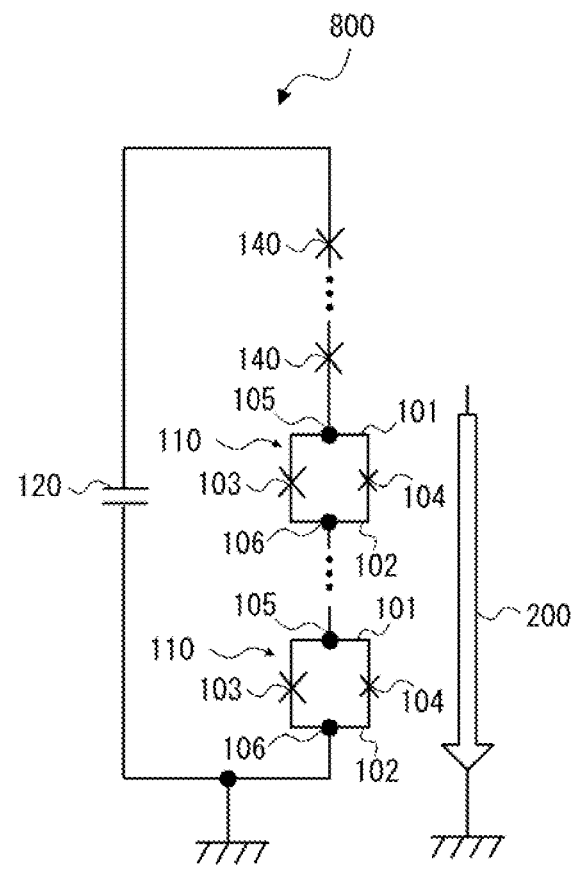
FIG. 12 is a schematic diagram showing an example of a Josephson parametric oscillator according to a fourth modified example.

In the above-described third modified example, the resonator 800 includes one loop circuit 110. However, as shown in FIG. 12, the resonator 800 may include a plurality of loop circuits 110. The resonator 800 shown in FIG. 12 includes a plurality of loop circuits 110, at least one Josephson junction 140, and a capacitor 120.

In the fourth modified example, the Josephson junctions 140 and the loop circuits 110 are also connected in series with each other. Note that although a plurality of Josephson junctions 140 are connected in series with one another as a group of junctions (i.e., in one place) and a plurality of loop circuits 110 are connected in series with one another as a group of loop circuits (i.e., in another place) in FIG. 12, the order of the arrangement of these Josephson junctions and loop circuits may be arbitrarily determined. Therefore, for example, the loop circuits 110 and the Josephson junctions 140 may be connected in series so that they are arranged in an alternate manner.

Further, in the fourth modified example, in the loop circuits 110, the first and second parts 105 and 106 also serve as connection points in the series connection. Further, in the Josephson junctions 140, both terminals of the Josephson junctions 140 serve as connection points in the series connection.

In the fourth modified example, a circuit in which a plurality of loop circuits 110 and at least one Josephson junction 140 are connected in series with one another is shunted by the capacitor 120. That is, it can be said that, by connecting a plurality of loop circuits 110, at least one Josephson junction 140, and the capacitor 120 in a ring shape, a loop circuit in which the plurality of loop circuits 110 are incorporated on the line of the loop is formed. Note that as shown in FIG. 12, the loop circuit in which the loop circuits 110, the Josephson junctions 140, and the capacitor 120 are connected in a ring shape may be connected to the ground.

In the fourth modified example, the magnetic field generation unit 200 also generates an alternating magnetic field and applies the generated alternating magnetic field to the loop circuits 110. However, while the magnetic field generation unit 200 applies an alternating magnetic field to one loop circuit 110 in the third modified example, the magnetic field generation unit 200 applies an alternating magnetic field to the plurality of loop circuits 110 in the fourth modified example. Therefore, the wiring line of the magnetic field generation unit 200 has a length that is determined according to the number of loop circuits 110.

The nonlinearity coefficient of the oscillator 16 shown in FIG. 12 is examined hereinafter. As described above, each loop circuit 110 is a circuit including Josephson junctions 103 and 104. Therefore, by regarding the loop circuit 110 as a circuit equivalent to Josephson junctions, it can be considered that increasing the number of loop circuits 110 to a plural number as in the case of this modified example is equivalent to increasing the number of Josephson junctions. The magnitude of the nonlinearity coefficient decreases according to the number of Josephson junctions. Therefore, the magnitude of the nonlinearity coefficient of the oscillator 16 decreases as the number of loop circuits 110 is increased. Therefore, the number of loop circuits 110 provided in the oscillator 16 does not necessarily has to be one. However, for the below-described reason, the number of loop circuits 110 is preferably one. That is, the loop circuit 110, i.e., the DC-SQUID, is a circuit that is affected by noises of the magnetic field. Therefore, as the number of loop circuits is increased, the circuits become more sensitive to the noises of the magnetic field, thus possibly increasing the probability of the malfunction of the circuits. Further, the length of the wiring line of the magnetic field generation unit 200 for uniformly applying the magnetic field to the plurality of loop circuits 110 increases according to the number of loop circuits 110. Therefore, the number of the loop circuits 110 is preferably one.

In each of the above-described third and fourth modified examples, a configuration in which at least one Josephson junction 140 and at least one loop circuit 110 are connected in series with one another in a lumped constant-type resonator is shown. However, they may be connected in series with one another in a distributed constant-type resonator. For example, as a modified example of the resonator 300 shown in FIG. 6, a resonator in which at least one Josephson junction 140 and at least one loop circuit 110 are connected in series with the waveguide 310 may be formed. Further, as a modified example of the resonator 400 shown in FIG. 7, a resonator in which at least one Josephson junction 140 and at least one loop circuit 110 are connected in series with one another between the waveguides 410 and 420 may be formed.

Fourth Example Embodiment

Next, an example embodiment in which the above-described oscillator is used as a quantum-bit circuit for a quantum computer will be described. Note that the term "quantum computer" means a quantum annealing-type computer that calculates a solution of an arbitrary problem that can be mapped onto an Ising model. As described above, the Josephson parametric oscillator generates a parametric oscillation when an alternating magnetic field having a frequency two times the resonant frequency is applied to the loop circuit 110. Note that the oscillation state can be either a first oscillation state or a second oscillation state the phases of which are different from each other by $\pi$. The first and second oscillation states correspond to quantum bits 0 and 1, respectively.

Figure 13:
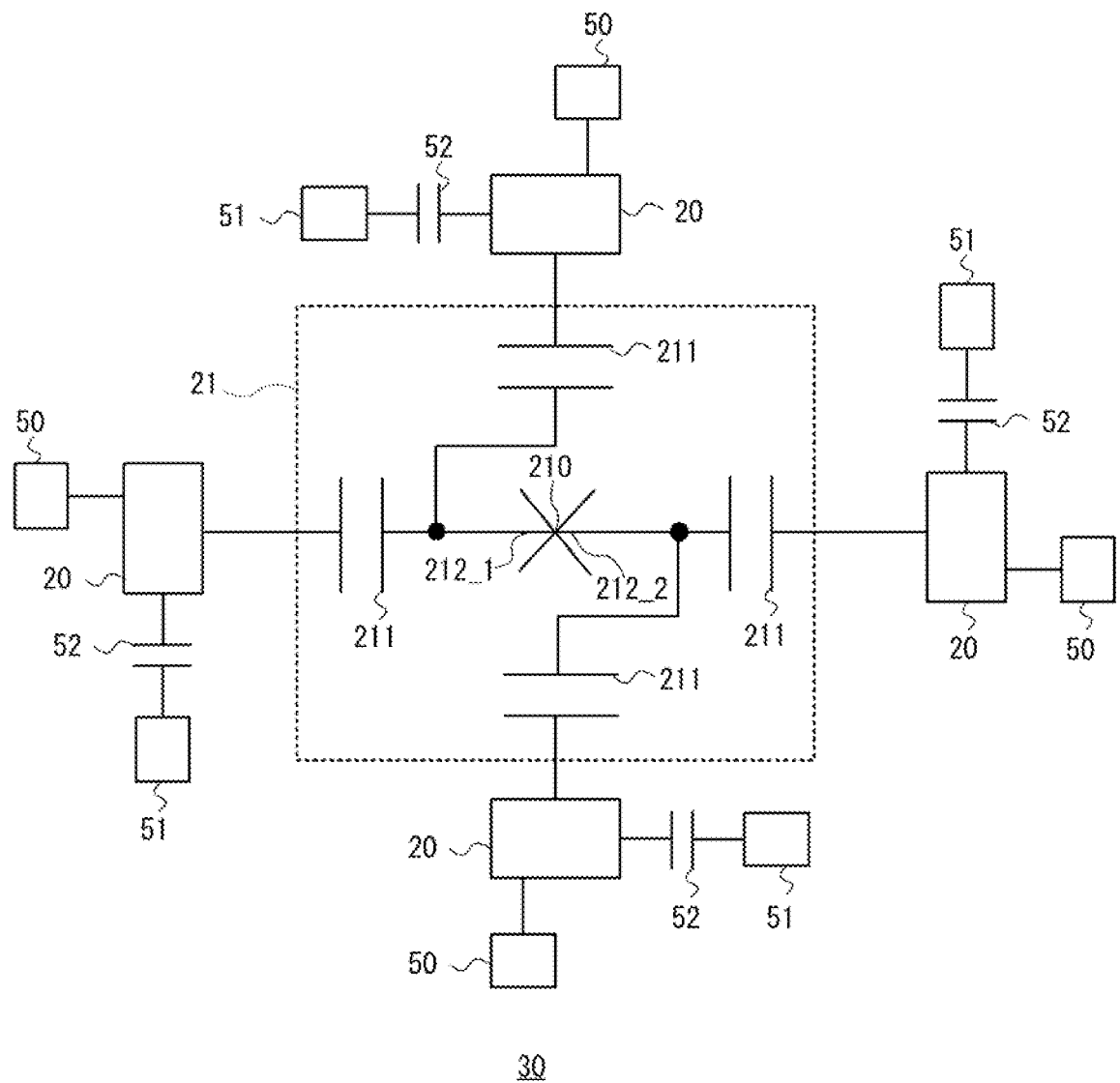
FIG. 13 is a schematic diagram showing a configuration of a quantum computer using an oscillator.

FIG. 13 is a schematic diagram showing a configuration of a quantum computer using the above-described oscillator. The configuration shown in FIG. 13 is one that is obtained by applying one of the above-described oscillators 11, 12, 13, 14, 15 and 16 in a configuration of a quantum computer disclosed by Puri. More specifically, the configuration shown in FIG. 13 is one that is obtained by applying, as an oscillator, one of the above-described oscillators 11, 12, 13, 14, 15 and 16 in, for example, a configuration shown in FIG. 4 of Puri. Note that, in FIG. 13, an oscillator 20 represents one of the oscillators 11, 12, 13, 14, 15 and 16.

In a quantum computer 30 shown in FIG. 13, four oscillators 20 are connected by one coupling circuit 21. More specifically, when the oscillator 20 is the oscillator 11, the coupling circuit 21 is connected to, for example, a part of the circuit between the waveguide 310 and the capacitor 52. Further, when the oscillator 20 is the oscillator 12, the coupling circuit 21 is connected to, for example, the capacitor 430. In this case, the capacitor 430 is connected to the coupling circuit 21 instead of being connected to the ground. That is, the coupling circuit 21 is connected to the waveguide 420 through the capacitor 430. Further, when the oscillator 20 is the oscillator 13, the coupling circuit 21 is connected to, for example, the shunt circuit of the resonator 500 (the circuit that shunts the loop circuit 110). Further, when the oscillator 20 is the oscillator 14, the coupling circuit 21 is connected to, for example, the shunt circuit of the resonator 600 (the series circuit that is composed of the capacitor 120 and the linear inductor 130, and shunts the loop circuit 110). Further, when the oscillator 20 is the oscillator 15, the coupling circuit 21 is connected to, for example, the shunt circuit of the resonator 700 (the parallel circuit that is composed of the capacitor 120 and the linear inductor 130, and shunts the loop circuit 110). Further, when the oscillator 20 is the oscillator 16, the coupling circuit 21 is connected to, for example, the shunt circuit of the resonator 800 (the circuit that shunts the circuit in which the loop circuit(s) 110 and the Josephson junctions 140 are connected in series with one another).

In the quantum computer 30, a current control unit 50 and a readout unit 51 is connected to each oscillator 20. That is, the current control unit 50 is connected to the magnetic field generation unit 200 of the oscillator 20. Further, the readout unit 51 is connected to the resonator of the oscillator 20 through an input/output capacitor 52.

The coupling circuit 21 is a circuit that couples four oscillators 20, and is formed by one Josephson junction 210 and four capacitors 211. The coupling circuit 21 couples, among the four oscillators 20, a first group of oscillators composed of two oscillators 20 and a second group of oscillators composed of the other two oscillators 20 through the Josephson junction 210. Note that each oscillator in the first group of oscillators is connected to a superconductor 212_1 through a respective capacitor 211. Further, each oscillator in the second group of oscillators is connected to a superconductor 212_2 through a respective capacitor 211. Note that the superconductor 212_1 is a wiring line connected to one terminal of the Josephson junction 210, and the superconductor 212_2 is a wiring line connected to the other terminal of the Josephson junction 210. That is, the superconductors 212_1 and 212_2 are joined with each other through the Josephson junction 210.

That is, a first oscillator 20 in the first group of oscillators is connected to one terminal of the Josephson junction 210 through a first capacitor 211. Further, a second oscillator 20 in the first group of oscillators is connected to the one terminal of the Josephson junction 210 through a second capacitor 211. Similarly, a third oscillator 20 in the second group of oscillators is connected to the other terminal of the Josephson junction 210 through a third capacitor 211. Further, a fourth oscillator 20 in the second group of oscillators is connected to the other terminal of the Josephson junction 210 through a fourth capacitor 211.

The current control unit 50 uses alternating currents (i.e., AC currents) having frequencies different from each other for the four oscillators 20. When the magnetic field generation unit 200 is composed of two wiring lines and a DC current is fed through one of the wiring lines and an alternating current is fed through the other wiring line, the wiring line for the alternating current may be a wiring line that is shared (i.e., also used) by a plurality of oscillators 20. That is, the wiring line for the alternating current may be formed so as to pass through (or pass near) the plurality of oscillators 20. In this case, in order to control the plurality of oscillators 20, a plurality of current control units 50 are connected to the wiring line for the alternating current, which is shared by the plurality of oscillators 20. Further, alternating currents having frequencies different from each other are superimposed on each other by these current control units 50.

Note that, in the configuration shown in FIG. 13, the current control units 50 may be arranged in a distributed manner in order to control the respective oscillators 20. Alternatively, the plurality of current control units 50 may be collectively disposed in one place. Further, although four readout units 51 are used in the configuration shown in FIG. 13, one readout unit 51 may read out the internal states of the four oscillators 20. In this case, the common readout unit 51 provided for a plurality of oscillators 20 individually reads out the internal state of each of the oscillators 20 by using the difference in the frequency used in each of the oscillators 20.

Figure 14:
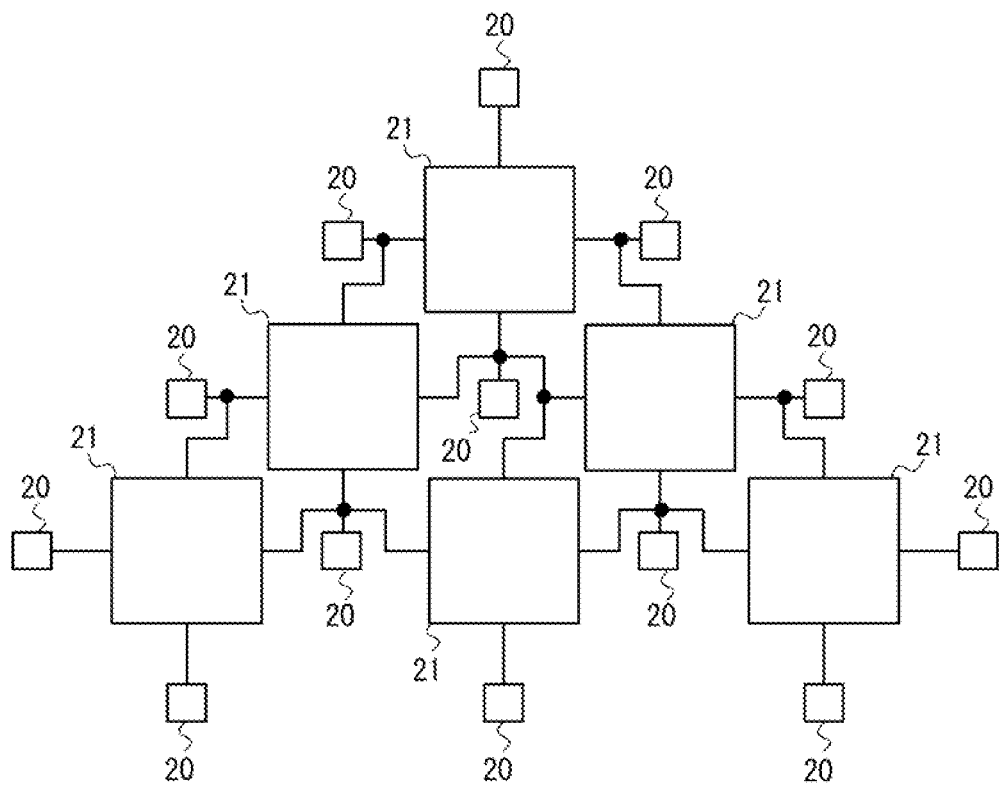
FIG. 14 is a schematic diagram showing a configuration of a quantum computer in which an oscillator is integrated therein.

Note that although a configuration of a quantum computer including four oscillators 20 is shown in FIG. 13, it is possible, by using the configuration shown in FIG. 13 as a unit structure, and arranging and connecting a plurality of such unit structures, to realize a quantum computer in which an arbitrary number of oscillators 20 are integrated. That is, a quantum computer having unit structures each of which is composed of four oscillators and a coupling circuit that couples the resonators of these four oscillators may be formed. FIG. 14 shows an example of such a configuration. FIG. 14 is a schematic diagram showing a configuration of a quantum computer 31 in which a plurality of oscillators 20 are integrated. In the configuration shown in FIG. 14, each coupling circuit 21 is connected with four oscillators 20 as shown in FIG. 13. Further, each of the oscillators 20 is connected to one to four coupling circuits 21 and the oscillators 20 are arranged so as to be shared by a plurality of unit structures, so that a configuration in which unit structures each of which is equivalent to the one shown in FIG. 13 are arranged is obtained. In the quantum computer 31, at least one oscillator 20 is connected to each of a plurality of coupling circuits 21. In particular, in the example shown in FIG. 14, at least one of the oscillators 20 is connected to four coupling circuits 21. Further, the quantum computer 31 can also be described as follows. The quantum computer 31 has a plurality of oscillators 20, and each of the oscillators 20 is connected to one to four coupling circuits 21. The number of coupling circuits 21 connected to one oscillator 20 corresponds to the number of unit structures that share that one oscillator 20. As described above, in the example shown in FIG. 14, the quantum computer 31 has a plurality of unit structures, and the oscillators 20 are shared by the plurality of unit structures. Although thirteen superconducting nonlinear oscillators are integrated in the quantum computer in the example shown in FIG. 14, an arbitrary number of oscillators 20 can be integrated in a quantum computer in a similar manner.

Note that no current control unit 50 and no read unit 51 are shown in FIG. 14 in order to make the understanding of the drawing easier. However, in practice, the oscillators 20 are controlled and their internal states are read out by using current control units 50 and read units 51. Further, the operating principle and the control method for a quantum computer are described in Puri, and the operating principle and the control method described in Puri are also applied to the quantum computer shown in FIGS. 13 and 14.

According to this example embodiment, it is possible to realize a quantum computer using a parametric oscillation in which oscillation conditions are prevented from becoming complicated.

Note that a superconducting nonlinear oscillator according to the present disclosure can be applied to gate-type quantum computing circuits as well as to quantum annealing circuits.

Note that the present disclosure is not limited to the above-described example embodiments and various changes may be made therein without departing from the spirit and scope of the disclosure.

Further, the whole or part of the example embodiments disclosed above can be described as, but not limited to, the following supplementary notes.

(Supplementary Note 1)

A resonator comprising at least one loop circuit in which a first superconducting line, a first Josephson junction, a second superconducting line, and a second Josephson junction are connected in a ring shape, wherein critical current values of the first and second Josephson junctions are different from each other.

(Supplementary Note 2)

The resonator described in Supplementary note 1, wherein
a ratio between the critical current values of the first and second Josephson junctions is 1+x: 1−x, and
a value of x is such a value that a slope from a maximum value of a resonance frequency of the resonator to a minimum value thereof in a function of a dependence of the resonance frequency on a magnetic field is larger than a predetermined value.

(Supplementary Note 3)

The resonator described in Supplementary note 2, wherein the value of x is such a value that the minimum value of the resonance frequency of the resonator in the function of the dependence of the resonance frequency on the magnetic field falls within a frequency band required for measurement of an output from the resonator.

(Supplementary Note 4)

The resonator described in Supplementary note 2 or 3, wherein the value of x is not smaller than 0.1 and not greater than 0.2.

(Supplementary Note 5)

The resonator described in any one of Supplementary notes 1 to 4, further comprising at least one third Josephson junction, wherein
the loop circuit and the third Josephson junction are connected in series with each other.

(Supplementary Note 6)

The resonator described in any one of Supplementary notes 1 to 5, further comprising a waveguide connected in series with the loop circuit.

(Supplementary Note 7)

The resonator described in any one of Supplementary notes 1 to 5, further comprising a capacitor, wherein
the capacitor and the loop circuit are connected in a ring shape.

(Supplementary Note 8)

The resonator described in Supplementary note 7, further comprising a linear inductor, wherein
a circuit comprising the capacitor and the linear inductor, and the loop circuit are connected in a ring shape.

(Supplementary Note 9)

The resonator described in Supplementary note 8, wherein the capacitor and the linear inductor are connected in series with each other.

(Supplementary Note 10)

The resonator described in Supplementary note 8, wherein the capacitor and the linear inductor are connected in parallel with each other.

(Supplementary Note 11)

An oscillator comprising:
a resonator described in any one of Supplementary notes 1 to 10; and
a magnetic field generation unit configured to apply a magnetic field to the loop circuit.

(Supplementary Note 12)

A quantum computer comprising, as a unit structure, four oscillators each of which is one described in Supplementary note 11, and a coupling circuit configured to couple resonators of these four oscillators.

(Supplementary Note 13)

The quantum computer described in Supplementary note 12, wherein
the quantum computer comprises a plurality of unit structures, and
the oscillator is shared by the plurality of unit structures.

According to the present disclosure, it is possible to provide a resonator, an oscillator, and a quantum computer capable of preventing oscillation conditions for generating a parametric oscillation from becoming complicated.

The first to fourth embodiments can be combined as desirable by one of ordinary skill in the art.

While the disclosure has been particularly shown and described with reference to embodiments thereof, the disclosure is not limited to these embodiments. It will be understood by those of ordinary skill in the art that various changes in form and details may be made therein without departing from the spirit and scope of the present disclosure as defined by the claims.

What is claimed is:

1. An oscillator comprising:
a resonator comprising at least one loop circuit in which a first superconducting line, a first Josephson junction, a second superconducting line, and a second Josephson junction are connected in a ring shape;
a magnetic field generation unit configured to apply a magnetic field to the at least one loop circuit; and
a current control unit configured to supply a DC current and an alternating current to the magnetic field generation unit,
wherein the at least one loop circuit is configured such that:
critical current values of the first and second Josephson junctions are different from each other.

2. The oscillator according to claim 1, further comprising at least one third Josephson junction, wherein
the loop circuit and the third Josephson junction are connected in series with each other.

3. The oscillator according to claim 1, further comprising a waveguide connected in series with the loop circuit.

4. The oscillator according to claim 1, further comprising a capacitor, wherein
the capacitor and the loop circuit are connected in a ring shape.

5. The oscillator according to claim 4, further comprising a linear inductor, wherein
a circuit comprising the capacitor and the linear inductor, and the loop circuit are connected in a ring shape.

6. The oscillator according to claim 5, wherein the capacitor and the linear inductor are connected in series with each other.

7. The oscillator according to claim 5, wherein the capacitor and the linear inductor are connected in parallel with each other.

8. A quantum computer comprising, as a unit structure, four oscillators and a coupling circuit, wherein
each of the oscillators comprises:
a resonator comprising at least one loop circuit in which: a first superconducting line, a first Josephson junction, a second superconducting line, and a second Josephson junction are connected in a ring shape; and critical current values of the first and second Josephson junctions are different from each other; and
a magnetic field generation unit configured to apply a magnetic field to the loop circuit, and
the coupling circuit couples resonators of the four oscillators.

9. The quantum computer according to claim 8, wherein
the quantum computer comprises a plurality of unit structures, and
the oscillator is shared by the plurality of unit structures.

10. A resonator comprising:
at least one loop circuit in which a first superconducting line, a first Josephson junction, a second superconducting line, and a second Josephson junction are connected in a ring shape;
a capacitor; and
a linear inductor,
wherein the at least one loop circuit is configured such that:
 critical current values of the first and second Josephson junctions are different from each other,
 the capacitor, the linear inductor, and the loop circuit are connected in a ring shape, and
 the capacitor and the linear inductor are connected in series with each other.

11. The oscillator according to claim 1, wherein
a ratio between the critical current values of the first and second Josephson junctions is 1+x:1−x, and
the value of x is not smaller than 0.1 and not greater than 0.2.

12. The oscillator according to claim 1, wherein
a current in which the DC current and the alternating current are superimposed flows through the magnetic field generation unit.

13. The oscillator according to claim 1, wherein
a function of a dependence of a resonance frequency of the resonator on a magnetic field has an inflection point at which a curvature of the function becomes zero, and
the resonance frequency corresponding to the inflection point falls within a frequency band required for measurement of an output from the resonator.

14. The oscillator according to claim 1, wherein
the oscillator generates a parametric oscillation by an alternating magnetic field.

15. The oscillator according to claim 14, wherein
a function of a dependence of a resonance frequency of the resonator on the alternating magnetic field has an inflection point at which a curvature of the function becomes zero, and
the magnitude of the alternating magnetic field corresponding to the inflection point falls within fluctuation range of the alternating magnetic field.

* * * * *